United States Patent
Banerjee

(10) Patent No.: US 11,442,490 B1
(45) Date of Patent: Sep. 13, 2022

(54) LOW DCD CLOCK SIGNAL GENERATORS

(71) Applicant: TEXAS INSTRUMENTS INCORPORATED, Dallas, TX (US)

(72) Inventor: Suvadip Banerjee, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/383,820

(22) Filed: Jul. 23, 2021

(51) Int. Cl.
*G06F 1/06* (2006.01)
*H03K 3/017* (2006.01)
*H03K 19/20* (2006.01)
*H03K 3/037* (2006.01)

(52) U.S. Cl.
CPC .............. *G06F 1/06* (2013.01); *H03K 3/017* (2013.01); *H03K 3/037* (2013.01); *H03K 19/20* (2013.01)

(58) Field of Classification Search
CPC combination set(s) only.
See application file for complete search history.

(56) References Cited

U.S. PATENT DOCUMENTS

| 5,231,395 A | * | 7/1993 | Irwin | ...................... H03M 3/34 341/118 |
| 9,639,719 B2 | * | 5/2017 | Kouwenhoven | ...... H02M 7/217 |

OTHER PUBLICATIONS

"All digital duty-cycle correction circuit design and its applications in high-performance DRAM"; Author: Feng (Dan) Lin; Date of Conference: Apr. 22-22, 2011; Date Added to IEEE Xplore: May 12, 2011.

* cited by examiner

*Primary Examiner* — Long Nguyen
(74) *Attorney, Agent, or Firm* — Michael T. Gabrik; Charles A. Brill; Frank D. Cimino

(57) ABSTRACT

Examples of clock generators with very low duty cycle distortion (DCD) are provided. A clock source and driver generate a main clock signal and a complementary clock signal that are input to a chopper circuit, which also receives complementary chopper control signals from a non-overlapping generator circuit. The chopper circuit is controlled to pass the main clock signal as a first output signal when the chopper circuit is in a first state, and pass the complementary clock signal as a second output signal when the chopper circuit is in a third state. In a second state, which occurs during each of the falling edges of the main clock signal, the chopper circuit holds the previous state, and does not transmit the falling edges of the main clock signal. The rising edges of the main clock signal is used to derive the rising and falling edges of the output signals.

19 Claims, 5 Drawing Sheets

LOW DCD CLOCK SIGNAL GENERATORS

FIELD OF DISCLOSURE

This disclosure relates to devices capable of generating clock signals with very low duty cycle distortion (DCD), and methods for generating such clock signals.

BACKGROUND

In the continuing development of high-speed communication systems, as the data transmission rate of I/O interfaces moves into the gigahertz range, jitter becomes a more important factor in limiting further improvements in data transmission rates and lengths. In general, jitter is the deviation of a timing event of a signal from its expected position. Jitter generally includes random jitter and deterministic jitter, the latter of which includes duty cycle distortion (DCD). DCD is characterized by asymmetry in rising and falling edge speeds, which may be caused by differences in the rise and fall times of complementary signals. The result of DCD is that the width of the data "eyes" is reduced and the eye crossing is offset from the 50% amplitude point.

With a slower rise time than fall time, the eye crossing is less than 50% of the total amplitude. Since the decision threshold is typically at 50%, such asymmetry creates a situation at each eye crossing in which some decisions are taken when the falling edge crosses the 50% amplitude point and others are taken when the rising edge crosses the 50% amplitude point.

While DCD jitter of a digital channel can be corrected end-to-end, the degree of such correction depends on the DCD of a clock signal generator used in the process. Generating an ultra-low DCD clock signal, however, is very difficult because of mismatches in characteristics of components, e.g., transistors, used in the clock signal generator. A better solution is thus desirable.

SUMMARY

In accordance with an example, a clock signal generator includes a clock source, a driver, a frequency divider, a generator circuit, and a chopper circuit. The clock source has first and second outputs. The driver has a first input coupled to the first output of the clock source, a second input coupled to the second output of the clock source, a first output at which a first clock signal (e.g., CLK) is output, and a second output at which a second clock signal (e.g., CLKz) is output. The frequency divider has an input coupled to the second output of the clock source, a first output, and a second output. The generator circuit has a first input coupled to the first output of the frequency divider, a second input coupled to the second output of the frequency divider, a first output at which a first chopper control signal (e.g., CHP) is output, and a second output at which a second chopper control signal (e.g., CHPz) is output. The chopper circuit has a first input coupled to the first output of the driver, a second input coupled to the second output of the driver, a third input coupled to the first output of the generator circuit, a fourth input coupled to the second output of the generator circuit, a first output at which a first output signal (e.g., OUTP) is output and a second output at which a second output signal (e.g., OUTM) is output.

In accordance with an example, a clock signal generator includes a complementary metal-oxide-semiconductor (CMOS) clock source, a CMOS driver, a D-type flip flop, a non-overlapping generator circuit, and a differential chopper circuit. The CMOS clock source includes a CMOS oscillator having an output, a buffer having an input coupled to the output of the CMOS oscillator, and an inverter having an input coupled to the output of the CMOS oscillator. The CMOS driver includes a first delay and buffer assembly having an input coupled to an output of the buffer and a second delay and buffer assembly having an input coupled to an output of the inverter. The D-type flip flop has a clock input coupled to the output of the inverter, a data input, a non-inverted output and an inverted output, the data input being coupled to the inverting output. The non-overlapping generator circuit having a first input coupled to the non-inverting output of the D-type flip flop and a second input coupled to the inverting output of the D-type flip flop. The differential chopper circuit has a first input coupled to an output of the first delay and buffer assembly, a second input coupled to an output of the second delay and buffer assembly, a third input coupled to a first output of the non-overlapping generator circuit, and a fourth input coupled to a second output of the non-overlapping generator circuit.

In accordance with an example, a method includes generating first and second intermediate clock signals, each at an input frequency; applying the first and second intermediate clock signals to a driver to generate first and second clock signals; applying the second intermediate clock signal to a frequency divider to generate first and second divided signals; applying the first and second divided signals to a generator circuit to generate first and second chopper control signals; and applying the first and second clock signals and the first and second chopper control signals to a chopper circuit to generate first and second output signals based on the rising edges of the first clock signal.

In accordance with an example, a system includes a clock signal generator and buffer driver configured to: generate first and second clock input signals, and generate first and second clock output signals based on the rising edges of the first clock input signal. The system also includes a transmission circuit coupled to clock signal generator; and a duty cycle distortion (DCD) corrector circuit coupled to the transmission circuit.

These and other features will be better understood from the following detailed description with reference to the accompanying drawings.

BRIEF DESCRIPTION OF THE DRAWINGS

Features of the disclosure may be understood from the following figures taken in conjunction with the detailed description.

The same reference numbers are used in the drawings to designate the same or similar (structurally and/or functionally) features.

DETAILED DESCRIPTION

Figure 1:
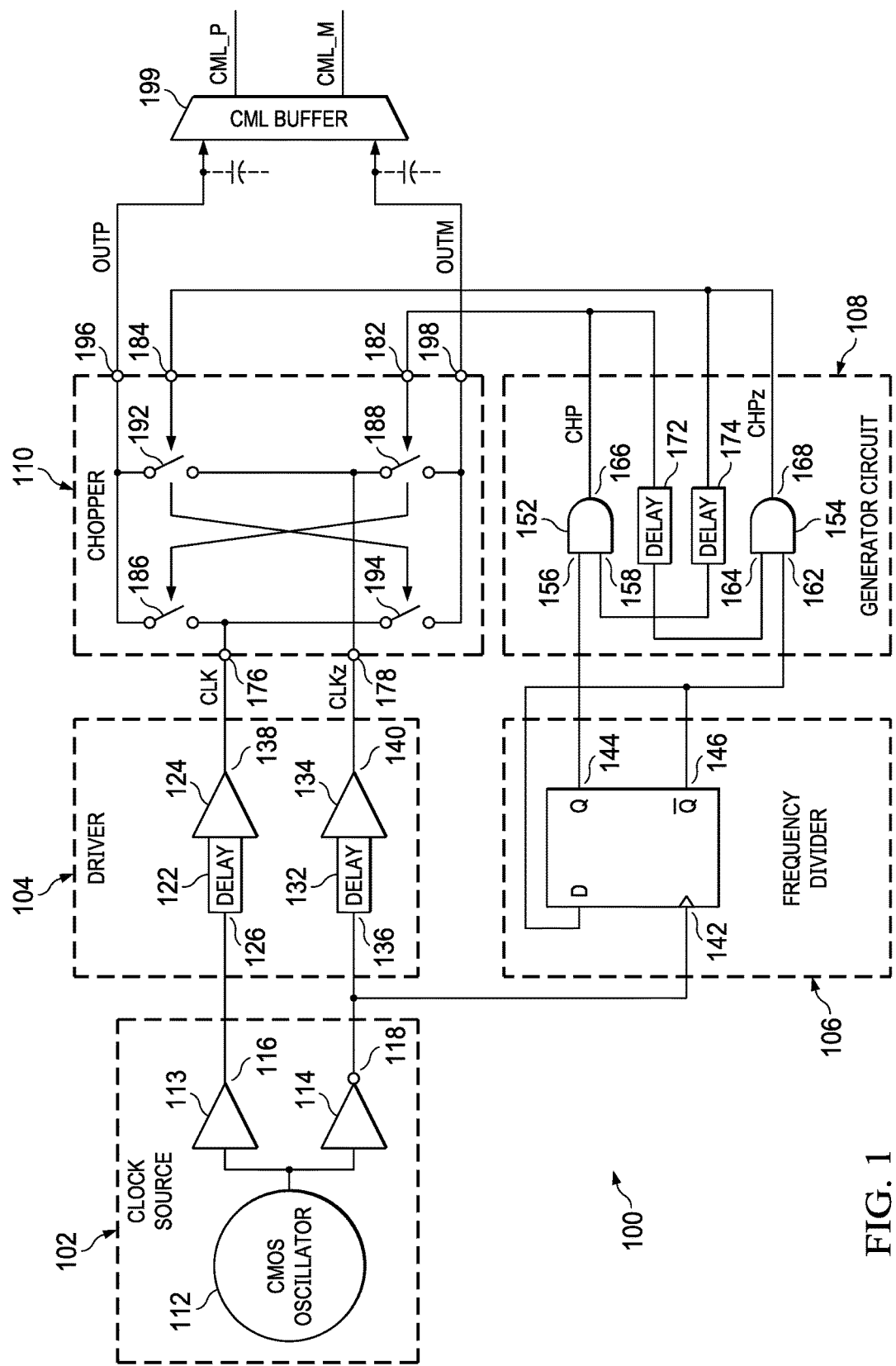
FIG. 1 is a block and schematic diagram of an example ultra-low DCD clock signal generator.

Specific examples are described below in detail with reference to the accompanying figures. These examples are not intended to be limiting. In the drawings, corresponding numerals and symbols generally refer to corresponding parts unless otherwise indicated. The objects depicted in the drawings are not necessarily drawn to scale.

In example arrangements, an ultra-low DCD clock signal generator and method of operating the same are provided. In an example, a complementary metal-oxide-semiconductor (CMOS) clock source and driver generate differential clock signals CLK and CLKz. In an example, based on the differential clock signals, two non-overlapping signals (CHP and CHPz) are generated and used to control a chopper circuit. In an example, the chopper circuit is implemented as an H-bridge with very low ON resistance compared to the driver, so as to minimize effect on the rise and fall times. In an example, the chopper circuit has three states: state 1 in which CLK is passed as a first output OUTP and CLKz is passed as a second output OUTM; state 2 in which the previous state is held or maintained; and state 3 in which CLK is passed as OUTM and CLKz is passed as OUTP. As a result of this three-state configuration, falling edges of CLK are not transmitted to the output; only rising edges of CLK are used to derive both edges of the output signals OUTP and OUTM. In this way, the DCD of CLK is canceled. Any DCD resulting from resistance mismatch in the H-bridge and/or capacitance mismatch between the transmission paths of OUTP and OUTM can be reduced to a very low amount by proper design and layout. Example ultra-low DCD clock signal generators provide advantages in terms of significantly lower DCD and lower current consumption and lower input capacitance.

FIG. 1 is a block and schematic diagram of an example ultra-low DCD clock signal generator (sometimes simply "clock generator") 100. In an example, clock generator 100 includes a clock source 102, which may be a complementary metal-oxide-semiconductor (CMOS) pseudo differential clock generator; a driver 104, which may be a CMOS driver; a frequency divider 106, which may be a CMOS frequency divider; a generator circuit 108, which may be a non-overlapping generator circuit; and a chopper circuit 110, which may be a differential chopper circuit.

Clock source 102 may include an oscillator 112, e.g., a CMOS oscillator, that generates a signal at an input frequency (e.g., 2f where each output signal has a frequency f). Clock source 102 may include a buffer 113 and an inverter 114, each of which has an input at which the signal generated by oscillator 112 is received. Buffer 113 has an output 116 at which a first intermediate clock signal is output, and inverter 114 has an output 118 at which a second intermediate clock signal is output.

Driver 104 may include a first delay 122 coupled to a first buffer 124, which collectively may be considered a first delay and buffer assembly. First delay 122 has an input 126 coupled to output 116 of buffer 113 to receive the first intermediate clock signal. Driver 104 may also include a second delay 132 coupled to a second buffer 134, which collectively may be considered a second delay and buffer assembly. Second delay 132 has an input 136 coupled to output 118 of inverter 114 to receive the second intermediate clock signal. First buffer 124 has an output 138 at which a first clock signal (CLK) is output, and second buffer 134 has an output 140 at which a second clock signal (CLKz) is output. CLK and CLKz may be complementary signals.

In an example, clock source 102 and driver 104 be integrated as a clock source with buffer driver.

In an example, frequency divider 106 may be implemented as a D-type flip flop with the inverting output terminal $\overline{Q}$ (NOT-Q) directly coupled to the data input terminal (D) in a feedback loop. In such example, the clock input of the D-type flip flop, denoted by reference numeral 142, is coupled to output 118 of inverter 114 to receive the second intermediate clock signal. The Q and $\overline{Q}$ terminals of the D-type flip flop form first and second outputs 144 and 146, respectively, of frequency divider 106. A first divided signal is output from the first output 144, e.g., the Q terminal, and a second divided signal is output from the second output 146, e.g., the $\overline{Q}$ terminal.

Generator circuit 108 may include two NAND gates 152 and 154, respectively. NAND gate 152 has a first input 156 coupled to output 144 of frequency divider 106 (which output corresponds to the Q terminal of the D-type flip flop in such implementation) to receive the first divided signal, and a second input 158. NAND gate 154 has a first input 162 coupled to output 146 of frequency divider 106 (which output corresponds to the $\overline{Q}$ terminal of the D-type flip flop in such implementation) to receive the second divided signal, and a second input 164. NAND gate 152 has an output 166 at which a first chopper control signal (CHP) is output, and NAND gate 154 has an output 168 at which a second chopper control signal (CHPz) is output. Each of CHP and CHPz has a frequency half that of the signal generated by oscillator 112. That is, when the input frequency is 2f, the frequency of each of CHP and CHPz is f.

NAND gates 152 and 154 may be configured such that the output of one is fed back to the second input of the other via a delay. To that end, in an example, generator circuit 108 includes first and second delays 172 and 174, respectively. First delay 172 has an input coupled to output 166 of NAND gate 152 and an output coupled to second input 164 of NAND gate 154. Similarly, second delay 174 has an input coupled to output 168 of NAND gate 154 and an output coupled to second input 158 of NAND gate 152. In this way, a delayed version of CHP is fed back to NAND gate 154, and a delayed version of CHPz is fed back to NAND gate 152. CHP and CHPz also used to control chopper circuit 110, as described below.

Chopper circuit 110 may have a first input 176 coupled to output 138 of buffer 124 to receive the first clock signal (CLK), and a second input 178 coupled to output 140 of buffer 134 to receive the second clock signal (CLKz). Chopper circuit 110 has a third input 182 at which CHP is received, and a fourth input 184 at which CHPz is received.

In an example, chopper circuit 110 is implemented as an H-bridge with low ON resistance. The H-bridge may have two pairs of switches. Switches 186 and 188 constitute one pair of switches, and switches 192 and 194 constitute another pair of switches. Switches 186 and 188 are controlled by the first chopper control signal (CHP), and switches 192 and 194 are controlled by the second chopper control signal (CHPz).

Switches 186 and 188 are configured to close when CHP is applied to input 182 of chopper circuit 110 to create a signal path through which CLK is passed from input 176 of chopper circuit 110 to its output 196 and is output as first output signal (OUTP) and to create another signal path through which CLKz is passed from input 178 of chopper circuit 110 to its output 198 and output as second output signal (OUTM). Switches 192 and 194 are configured to close in response to application of CHPz to input 184 of chopper circuit 110. In this case, the signal paths created in chopper circuit 110 route CLK from input 176 to output 198 as the first output signal (OUTP) and route CLKz from input 178 to output 196 as the second output signal (OUTM). OUTP and OUTM may be complementary signals, and the capacitance in the signal lines on which OUTP and OUTM are transmitted are represented by the capacitor symbols shown in dashed lines.

Clock generator 100 may also include a buffer 199, which may be a common mode logic (CML) buffer. In an example, buffer 199 includes an input, which is coupled to output 196 of chopper circuit 110, at which OUTP is received, and an input, which is coupled to output 198 of chopper circuit 110, at which OUTM is received. After receipt, OUTP and OUTM may be buffered in buffer 199 and output as signals CML_P and CML_M, respectively.

Figure 2:
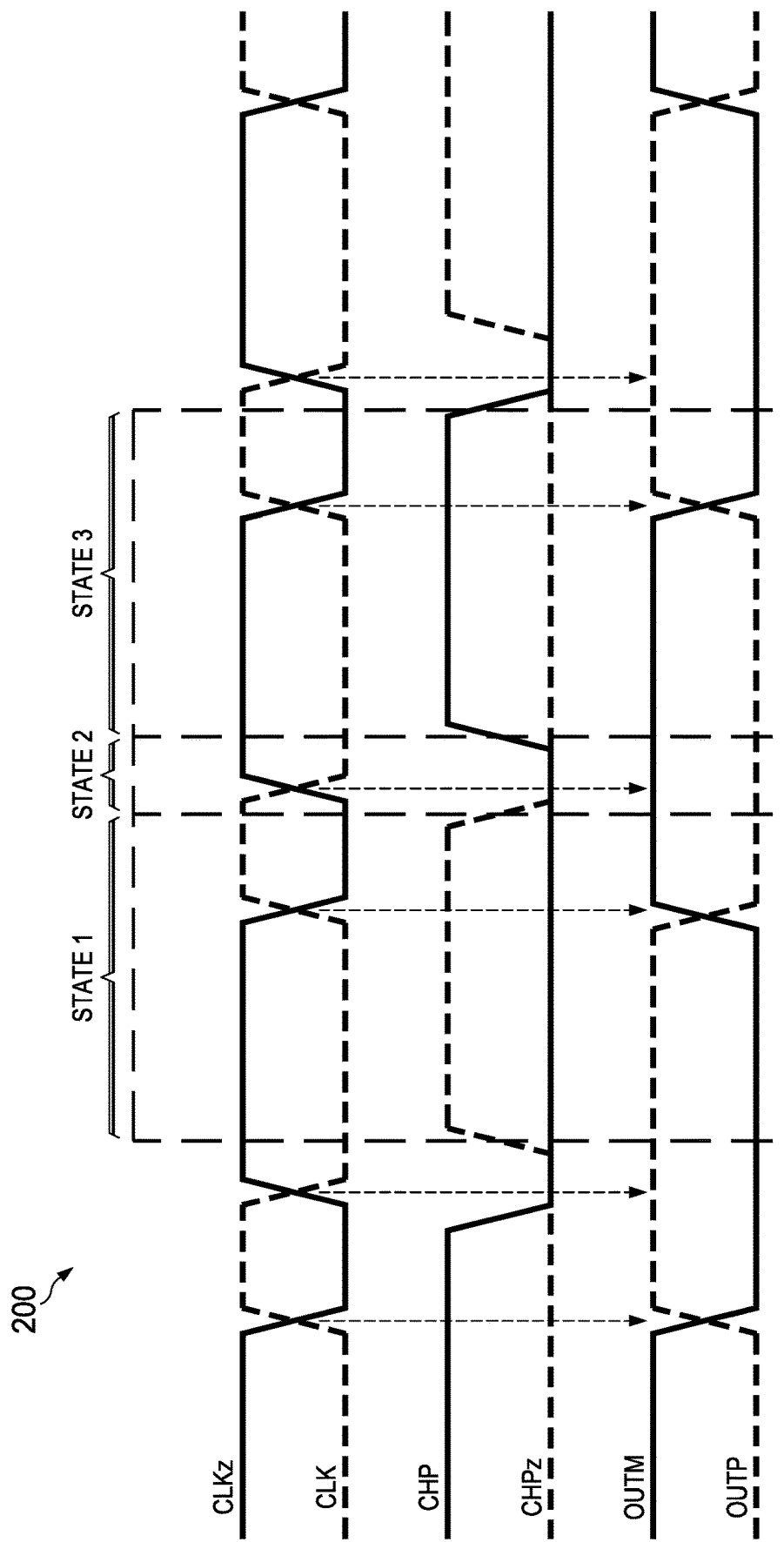
FIG. 2 shows waveforms of various signals of the example ultra-low DCD clock signal generator with respect to time.

FIG. 2 shows waveforms 200, including signals CLK, CLKz, CHP, CHPz, OUTP and OUTM with respect to time during exemplary operation of example ultra-low DCD clock signal generator 100. An example of where each of the three states of chopper circuit 110 occurs relative to the waveforms is also shown. In state 1, switches 186 and 188 are closed in response to assertion of the first chopper control signal (CHP), and chopper circuit 110 passes the first clock signal (CLK) as the first output signal (OUTP) and passes the second clock signal (CLKz) as the second output signal (OUTM). In state 2, chopper circuit 100 holds or maintains its immediate previous state, e.g., either state 1 or state 3, which means that all switches 186, 188, 192 and 194 are in the open position. In state 3, switches 192 and 194 are closed in response to assertion of the second chopper control signal (CHPz), and chopper circuit 110 passes the first clock signal (CLK) as the first output signal (OUTP) and passes the second clock signal (CLKz) as the second output signal (OUTM).

The effect of controlling chopper circuit 110 as described above is that none of the falling edges of CLK is transmitted to the output when chopper circuit 110 is in the hold state, i.e., state 2, and that any DCD that occurs with respect to a rising edge of CLK and a corresponding falling edge of CLKz in state 1 is canceled out by DCD in the subsequent cross-over of a falling edge of OUTM and a rising edge of OUTP. As viewed from left to right in FIG. 2, the second, fourth and sixth downward dashed arrows depict the waveforms in state 2. The rising edges of CLK, identified by the first, third and fifth downward dashed arrows (viewed from left to right in FIG. 2), are used to derive both the rising and edges of OUTP and OUTM. As a result, DCD of CLK is substantially reduced or canceled. Moreover, with proper layout matching techniques, any DCD resulting from resistance mismatch in chopper circuit 110, e.g., in the H-bridge, and/or capacitance mismatch between OUTP and OUTM can be reduced to a very low amount.

Figure 3:
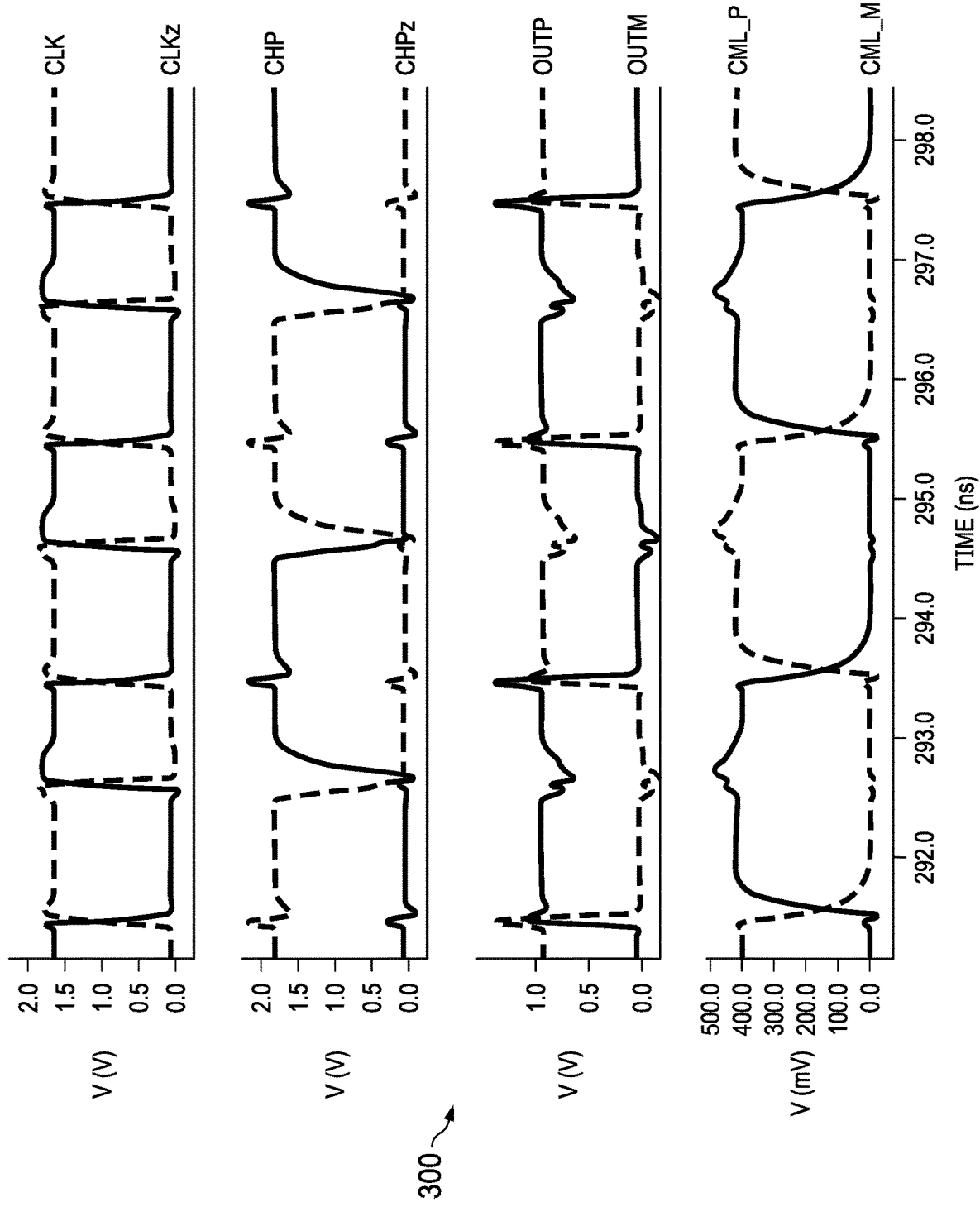
FIG. 3 shows various single-ended waveforms of the example ultra-low DCD clock signal generator with respect to time.
Figure 4:
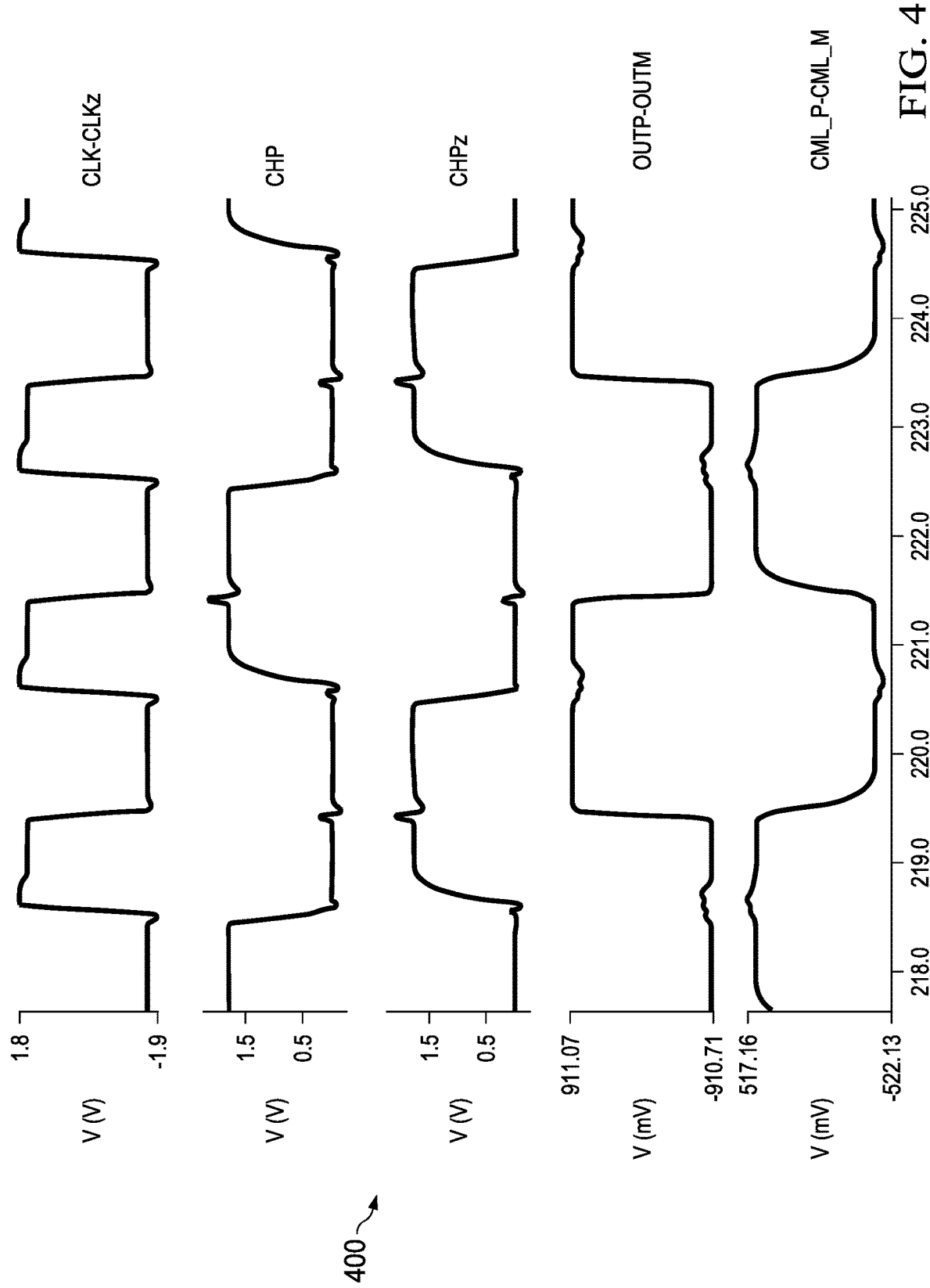
FIG. 4 shows various differential waveforms of the example ultra-low DCD clock signal generator with respect to time.

FIG. 3 shows single-ended waveforms 300 of CLK, CLKz, CHP, CHPz, OUTP, OUTM, CML_P, and CML_M during exemplary operation of ultra-low DCD clock signal generator 100. FIG. 4 shows differential waveforms 400 CLK-CLKz, OUTP-OUTM, and CML_P-CML_M, as well as single-ended waveforms CHP and CHPz, during exemplary operation of clock generator 100. Referring to FIG. 4, it can be seen that differential waveform CLK-CLKz has the asymmetrical rise and fall edges, which is indicative of DCD. On the other hand, it can be seen that DCD is substantially eliminated in OUTP-OUTM and CML_P-CML_M waveforms.

Figure 5:
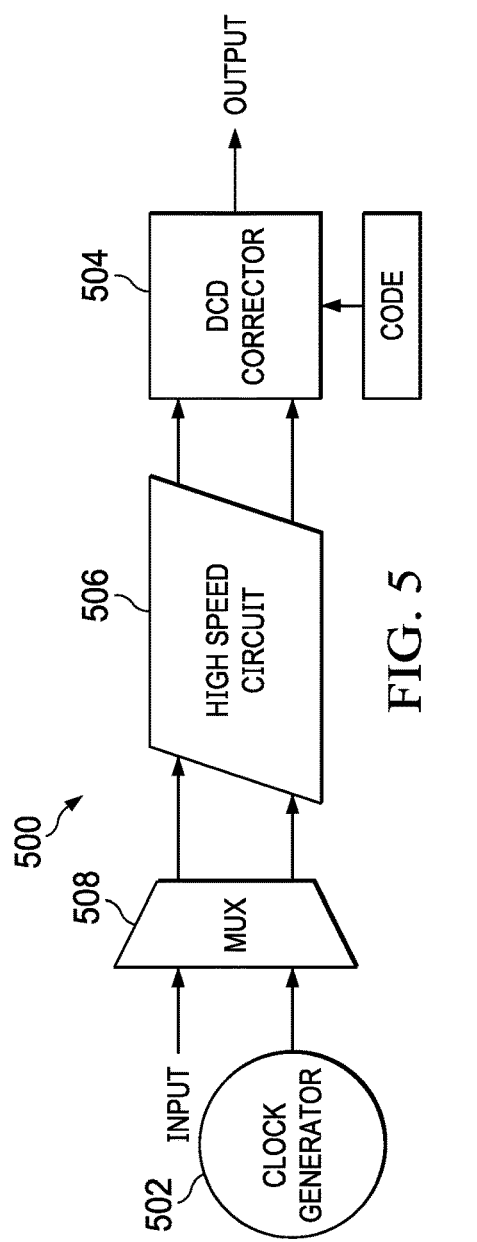
FIG. 5 is a block diagram showing an example environment of an ultra-low DCD clock signal generator.

FIG. 5 is a block diagram showing an example DCD correction scheme. System 500 includes an ultra-low DCD clock signal generator 502, which may correspond to clock generator 100 of FIG. 1. System 500 also includes a DCD corrector 504 coupled to a high-speed circuit 506. An input terminal of a multiplexer (MUX) 508 is coupled to clock signal generator 502 and another input terminal of multiplexer 508 is coupled to receive input data (INPUT). Multiplexer 508 has low DCD so as not to interfere with DCD correction of system 500. At startup or during a standby period, multiplexer 508 switches off the data input and selects the clock signal input to perform DCD correction. Multiplexer 508 passes the clock signals to high-speed circuit 506, which outputs such signals to DCD corrector 504 that has access to a stored code, which DCD corrector 504 uses in the correction scheme. The code is selected to zero out the combined DCD of clock signal generator 502 and high-speed circuit 506. The lower the DCD in clock signal generator 502, the better the overall DCD correction result is. Examples of such an ultra-low DCD clock signal generator are provided herein.

Figure 6:
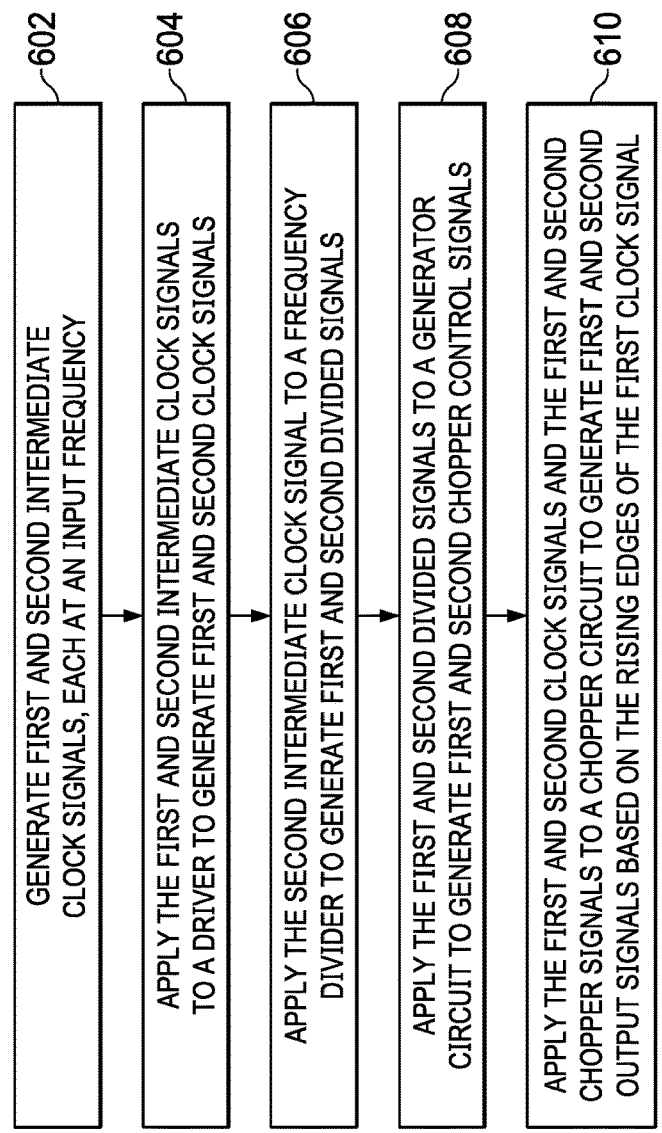
FIG. 6 is a flow diagram of an example of operating an ultra-low DCD clock signal generator.

FIG. 6 is a flow diagram of an example method 600 of operating ultra-low DCD clock generator 100. At operation 602, first and second intermediate clock signals, each at an input frequency, are generated. At operation 604, the first and second intermediate clock signals are applied to a driver to generate first and second clock signals. At operation 606, the second intermediate clock signal is applied to a frequency divider to generate first and second divided signals. At operation 608, the first and second divided signals are applied to a generator circuit to generate first and second chopper control signals. At operation 610, the first and second clock signals and the first and second chopper control signals are applied to a chopper circuit to generate first and second output signals based on the rising edges of the first clock signal.

FIG. 6 depicts one possible order of operations to operate example ultra-low DCD clock generator 100. Not all operations need necessarily be performed in the order described. Some operations may be combined into a single operation. Additional operations and/or alternative operations may be performed.

For example, consistent with the description above, further operations may be performed, such as passing the first clock signal as the first output signal and passing the second clock signal as the second output signal when the chopper circuit is in a first state; passing the first clock signal as the second output signal and passing the second clock signal as the first output signal when the chopper circuit is in a third state; and maintaining an immediate previous state when the chopper circuit is in a second state.

Other operations may include closing each of a first pair of switches to place the chopper circuit in the first state; and closing each of a second pair of switches to place the chopper circuit in the second state. Still other operations may include applying the first divided signal to a first input of a first NAND gate and applying a delayed second chopper signal to a second input of the first NAND gate to generate the first chopper signal; and applying the second divided signal to a first input of a second NAND gate and applying a delayed first chopper signal to a second input of the second NAND gate to generate the second chopper signal.

Various examples of ultra-low DCD clock generators are provided. In some examples, a CMOS clock source and driver assembly generate differential clock signals CLK and CLKz. In an example, based on the differential clock signals, two non-overlapping signals (CHP and CHPz) are generated and used to control a three-state chopper circuit. With such configuration, falling edges of CLK are not transmitted to the output; only rising edges of CLK are used to derive both edges of the output signals OUTP and OUTM. In this way, the DCD of CLK is canceled. Example ultra-low DCD clock signal generators advantageously provide significantly lower DCD, as well as lower current consumption and lower input capacitance.

The term "couple" is used throughout the specification. The term and derivatives thereof may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the term "terminal" means "node", "interconnection", "pin" and/or "lead". Unless specifically stated to the contrary, these terms are generally used to mean an interconnection between or a terminus of a device element, a circuit element, an integrated circuit, a device or other electronic or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of CMOS fabrication technology is described herein, other fabrication technologies using other types of transistors (or equivalent devices) may be used instead. For example, instead of using p-type and n-type metal-oxide-silicon field-effect transistors (MOSFETs), other transistors, e.g., bipolar junction transistors (BJTs), may be used instead.

Circuits described herein are reconfigurable to include the replaced components to provide functionality at least partially similar to functionality available prior to the component replacement. Components shown as delays, unless otherwise stated, are generally representative of one or more delay elements coupled in series and/or parallel to provide a specific amount of delay.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value.

Modifications of the described examples are possible, as are other examples, within the scope of the claims. Moreover, features described herein may be applied in other environments and applications consist with the teachings provided.

What is claimed is:

1. A clock signal generator comprising:
   a clock source having first and second outputs;
   a driver having a first input coupled to the first output of the clock source, a second input coupled to the second output of the clock source, a first output at which a first clock signal is output, and a second output at which a second clock signal is output;
   a frequency divider having an input coupled to the second output of the clock source, a first output, and a second output;
   a generator circuit having a first input coupled to the first output of the frequency divider, a second input coupled to the second output of the frequency divider, a first output at which a first chopper control signal is output, and a second output at which a second chopper control signal is output; and
   a chopper circuit having a first input coupled to the first output of the driver, a second input coupled to the second output of the driver, a third input coupled to the first output of the generator circuit, a fourth input coupled to the second output of the generator circuit, a first output at which a first output signal is output and a second output at which a second output signal is output.

2. The clock signal generator of claim 1, wherein the clock source includes:
   an oscillator configured to generator an oscillator signal at an input frequency;
   a buffer having an input configured to receive the oscillator signal and output a first intermediate clock signal at the first output of the clock source; and
   an inverter having an input configured to receive the oscillator signal and output a second intermediate clock signal at the second output of the clock source.

3. The clock signal generator of claim 1, wherein the driver includes:
   a first buffer having the first input and the first output; and
   a second buffer having the second input and the second output.

4. The clock signal generator of claim 1, wherein the generator circuit includes:
   a first NAND gate having the first input and the first output of the generator circuit; and
   a second NAND gate having the second input and the second output of the generator circuit,
   wherein the first NAND gate has a second input coupled to the second output of the generator circuit, and the second NAND gate has a second input coupled to the first output of the generator circuit.

5. The clock signal generator of claim 4, wherein the generator circuit includes:
   a first delay coupled between the first output of the generator circuit and the second input of the second NAND gate; and
   a second delay coupled between the second output of the generator circuit and the second input of the first NAND gate.

6. The clock signal generator of claim 1, wherein the chopper circuit includes:
   a first pair of switches responsive to the first chopper control signal; and
   a second pair of switches responsive to the second chopper control signal.

7. The clock signal generator of claim 6, wherein the first pair of switches are configured to close in response to the first chopper signal to pass the first clock signal as the first output signal and to pass the second clock signal as the second output signal.

8. The clock signal generator of claim 7, wherein the second pair of switches are configured to close in response to the second chopper signal to pass the first clock signal as the second output signal and to pass the second clock signal as the first output signal.

9. The clock signal generator of claim 1, wherein the chopper circuit is configured to have a first state in which the first clock signal is passed as the first output signal and the second clock signal is passed as the second output signal, a second state in which the first clock signal is passed as the second output signal and the second clock signal is passed as the first output signal, and a third state in which a previous state is maintained.

10. The clock signal generator of claim 2, wherein each of the first and second chopper control signals has a frequency that is half that of the input frequency.

11. A clock signal generator comprising:
   a complementary metal-oxide-semiconductor (CMOS) clock source including a CMOS oscillator having an output, a buffer having an input coupled to the output of the CMOS oscillator, and an inverter having an input coupled to the output of the CMOS oscillator;
   a CMOS driver including a first delay and buffer assembly having an input coupled to an output of the buffer and a second delay and buffer assembly having an input coupled to an output of the inverter;
   a D-type flip flop having a clock input coupled to the output of the inverter, a data input, a non-inverted output and an inverted output, the data input being coupled to the inverting output;
   a non-overlapping generator circuit having a first input coupled to the non-inverting output of the D-type flip flop and a second input coupled to the inverting output of the D-type flip flop; and
   a differential chopper circuit having a first input coupled to an output of the first delay and buffer assembly, a second input coupled to an output of the second delay and buffer assembly, a third input coupled to a first output of the non-overlapping generator circuit, and a fourth input coupled to a second output of the non-overlapping generator circuit.

12. The clock signal generator of claim 11, wherein the differential chopper circuit is configured to have a first state in which a first clock signal output received at the first input of the differential chopper circuit is passed as a first output signal and a second clock signal received at the second input of the differential chopper is passed as the second output signal, a second state in which the first clock signal is passed as the second output signal and the second clock signal is passed as the first output signal, and a third state in which a previous state is maintained.

13. A method comprising:
   generating first and second intermediate clock signals, each at an input frequency;
   applying the first and second intermediate clock signals to a driver to output first and second clock signals;
   applying the second intermediate clock signal to a frequency divider to generate first and second divided signals;
   applying the first and second divided signals to a generator circuit to generate first and second chopper control signals; and
   applying the first and second clock signals and the first and second chopper control signals to a chopper circuit to generate first and second output signals based on the rising edges of the first clock signal.

14. The method of claim 13, comprising:
   passing the first clock signal as the first output signal and passing the second clock signal as the second output signal when the chopper circuit is in a first state;
   passing the first clock signal as the second output signal and passing the second clock signal as the first output signal when the chopper circuit is in a third state; and
   maintaining an immediate previous state when the chopper circuit is in a second state.

15. The method of claim 14, comprising:
   closing each of a first pair of switches of the chopper circuit to place the chopper circuit in the first state; and
   closing each of a second pair of switches of the chopper circuit to place the chopper circuit in the second state.

16. The method of claim 13, comprising:
   applying the first divided signal to a first input of a first NAND gate of the generator circuit and applying a delayed second chopper signal to a second input of the first NAND gate to generate the first chopper signal.

17. The method of claim 13, comprising:
   applying the second divided signal to a first input of a second NAND gate of the generator circuit and applying a delayed first chopper signal to a second input of the second NAND gate to generate the second chopper signal.

18. A system comprising the clock signal generator of claim 1.

19. The system of claim 18, further comprising:
   a transmission circuit coupled to the clock signal generator; and
   a duty cycle distortion (DCD) corrector circuit coupled to the transmission circuit,
   wherein the DCD corrector circuit is configured to correct DCD in the transmission circuit based on a code input to the DCD corrector circuit.

* * * * *